(12) United States Patent
Hu et al.

(10) Patent No.: US 9,337,329 B2
(45) Date of Patent: May 10, 2016

(54) METHOD OF FABRICATION AND DEVICE CONFIGURATION OF ASYMMETRICAL DMOSFET WITH SCHOTTKY BARRIER SOURCE

(75) Inventors: Yongzhong Hu, Cupertino, CA (US); Sung-Shan Tai, San Jose, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 1032 days.

(21) Appl. No.: 13/199,795

(22) Filed: Sep. 8, 2011

(65) Prior Publication Data
US 2012/0083084 A1 Apr. 5, 2012

Related U.S. Application Data

(62) Division of application No. 11/355,128, filed on Feb. 14, 2006, now Pat. No. 8,022,482.

(51) Int. Cl.
| | | |
|---|---|---|
| H01L 21/8234 | (2006.01) | |
| H01L 29/78 | (2006.01) | |
| H01L 29/66 | (2006.01) | |
| H01L 21/285 | (2006.01) | |
| H01L 29/417 | (2006.01) | |
| H01L 29/45 | (2006.01) | |

(52) U.S. Cl.
CPC ...... *H01L 29/7813* (2013.01); *H01L 21/28518* (2013.01); *H01L 21/823418* (2013.01); *H01L 29/665* (2013.01); *H01L 29/66507* (2013.01); *H01L 29/66727* (2013.01); *H01L 29/66734* (2013.01); *H01L 29/7806* (2013.01); *H01L 29/7839* (2013.01); *H01L 29/7845* (2013.01); *H01L 29/41766* (2013.01); *H01L 29/456* (2013.01); *H01L 2924/0002* (2013.01)

(58) Field of Classification Search
CPC ............ H01L 29/456; H01L 29/66727; H01L 29/66734; H01L 29/41766; H01L 29/7839; H01L 27/47; H01L 27/7839; H01L 29/66666; H01L 29/66712; H01L 21/0435; H01L 21/0495; H01L 21/28537; H01L 21/28581; H01L 27/095; H01L 29/0619; H01L 29/66257; H01L 29/806; H01L 29/66507; H01L 29/665; H01L 29/7845; H01L 29/458; H01L 21/823418
See application file for complete search history.

(56) References Cited

U.S. PATENT DOCUMENTS

| | | | |
|---|---|---|---|
| 6,861,701 B2 * | 3/2005 | Williams et al. | 257/329 |
| 7,504,690 B2 * | 3/2009 | Kelly et al. | 257/328 |
| 2004/0012050 A1 * | 1/2004 | Uno et al. | 257/330 |
| 2010/0059819 A1 * | 3/2010 | Snyder | 257/343 |

* cited by examiner

*Primary Examiner* — Phat X Cao
*Assistant Examiner* — Diana C Vieira
(74) *Attorney, Agent, or Firm* — Bo-In Lin

(57) ABSTRACT

A trenched semiconductor power device includes a trenched gate insulated by a gate insulation layer and surrounded by a source region encompassed in a body region above a drain region disposed on a bottom surface of a semiconductor substrate. The source region surrounding the trenched gate includes a metal of low barrier height to function as a Schottky source and that may include a PtSi, ErSi layer and may further be a metal silicide layer having the low barrier height. A top oxide layer is disposed under a silicon nitride spacer on top of the trenched gate for insulating the trenched gate from the source region. A source contact disposed in a trench opened into the body region for contacting a body-contact dopant region and covering with a conductive metal layer such as a Ti/TiN layer.

15 Claims, 8 Drawing Sheets

METHOD OF FABRICATION AND DEVICE CONFIGURATION OF ASYMMETRICAL DMOSFET WITH SCHOTTKY BARRIER SOURCE

The Patent Application is a Divisional Patent Application and claims the Priority of a previously filed patent application Ser. No. 11/355,128 that was filed on Feb. 14, 2006 now U.S. Pat. No. 8,022,482 by the same inventors of this Patent Application, and the disclosures made in application Ser. No. 11/355,128 are hereby incorporated by reference.

BACKGROUND OF THE INVENTION

1. Field of the Invention

The invention relates generally to the semiconductor power devices. More particularly, this invention relates to an improved and novel device manufacturing process to provide asymmetrical double diffusion metal oxide semiconductor field effect transistor (DMOSFET) with Schottky barrier source implemented with low-barrier height rare earth metal silicide for a best drive current without subject to a limitation of the high temperature processes and meanwhile providing low contact resistance of source and body contacts, which is achieved through silicided contact on the entire mesa area totally insulated from the trenched gates covered under an insulated spacer.

2. Description of the Prior Art

It is known in the semiconductor power industry to implement a Schottky barrier source or metal silicide source electrode to overcome the parasitic bipolar conduction in a DMOSFET device. In order to prevent an unclamped inductor switching (UIS) in the semiconductor power device, it is necessary to reduce the parasitic bipolar conduction. With the implementation of Schottky barrier source the theoretical emitter efficiency at the source is reduced by orders of magnitude compared to the conventional silicon source junction structures. Such configuration can significantly eliminate the parasitic bipolar gain of the device. However, conventional manufacturing processes are still limited by the use of metals of high barrier height. The devices as now available to those of ordinary skill in the art therefore suffers low drive current and subject to potential increased body bias and reducing the gate drive or even forward bias the body-source junction and initiate a snapback.

U.S. Pat. No. 4,675,713 discloses a method of using the source Schottky junction as the body contact for a semiconductor power device as shown in FIG. 1A. The patented disclosure uses a low minority carrier injecting source region. A metal silicide layer is implemented to form the low minority carrier injection source region. The metal silicide source provides a source of majority carriers and meanwhile reducing the minority carrier injection and hence reducing the parasitic bipolar transistor action. However, the higher barrier height of the source contact can potentially increase the body bias and reduce the gate drive, or even increase the forward bias of the body-source junction and initiate a snapback.

U.S. Pat. No. 4,983,535 discloses a fabrication method to manufacture a DMOS device shown in FIG. 1B. The method includes the processing steps use a starting material of a heavily doped silicon wafer, which has an epitaxial layer thereon. A DMOS body region is diffused into the epitaxial layer and a deep body contact region created. The source is a refractory metal Schottky barrier located on top of the body region. A trench is etched into the epitaxial layer so as to fully penetrate the body region and the trench surfaces oxidized to form a gate oxide. The trench is then filled with doped polysilicon to create a gate electrode. The resulting DMOS has a relatively short channel and the parallel bipolar parasitic transistor cannot be turned on. Since the method forms the Schottky barrier source prior to the trench and gate formation, therefore only refractory metal with high barrier height can be used. For this reasons, the device suffers a low drive current.

Therefore, a need still exists in the art of power semiconductor device design and manufacture to provide new manufacturing method and device configuration in forming the power devices such that the above discussed problems and limitations can be resolved.

SUMMARY OF THE PRESENT INVENTION

It is therefore an aspect of the present invention to provide a new and improved semiconductor power device implemented with a process of forming the trench and recessed poly gate, and furnishing the body contact implant and activation prior to the metal Schottky barrier formation. Therefore, all the high-temperature processing steps are done before the metal source silicidation. The new and improved manufacturing process enables the employment of low-barrier height rare earth metal silicide for the best drive current. The above-discussed difficulties as confronted by the conventional technologies are therefore resolved.

Furthermore, this invention discloses a trench contact is formulated through mask and etching of the Schottky metal silicide at body contact region. This process provides a direct ohmic contact to the transistor body. Subsequent process steps eventually implement a metallization to contact the whole mesa region that includes the source and body contact. The metallization contact thus achieves a much-reduced contact resistance.

Briefly in a preferred embodiment this invention discloses a trenched semiconductor power device comprising a trenched gate insulated by a gate insulation layer and surrounded by a source region encompassed in a body region above a drain region disposed on a bottom surface of a semiconductor substrate. The semiconductor power device further includes a source contact trench opened into the body region having a source contact dopant region disposed below and around sidewalls of the source contact trench to electrically contact the source region. The semiconductor power device further includes a source contact comprising a source contact conductive layer covering a bottom surface of the source contact trench contacting the source contact dopant region below the source contact trench wherein the source contact trench is further filled with an insulation material covering the conductive source contact layer. In a preferred embodiment, the semiconductor power device further includes a metal layer disposed under the insulation layer covering the source contact conductive layer for electrically contacting a top surface of the source region. In another preferred embodiment, the semiconductor power device further includes a silicide metal layer disposed under the insulation layer covering the source contact conductive layer for forming a salicided source conductive layer on the bottom surface of the source contact trench and the silicide metal layer further extending from the source contact trench for electrically contacting a top surface of the source region These and other objects and advantages of the present invention will no doubt become obvious to those of ordinary skill in the art after having read the following detailed description of the preferred embodiment, which is illustrated in the various drawing figures.

DETAILED DESCRIPTION OF THE METHOD

Figure 1A:
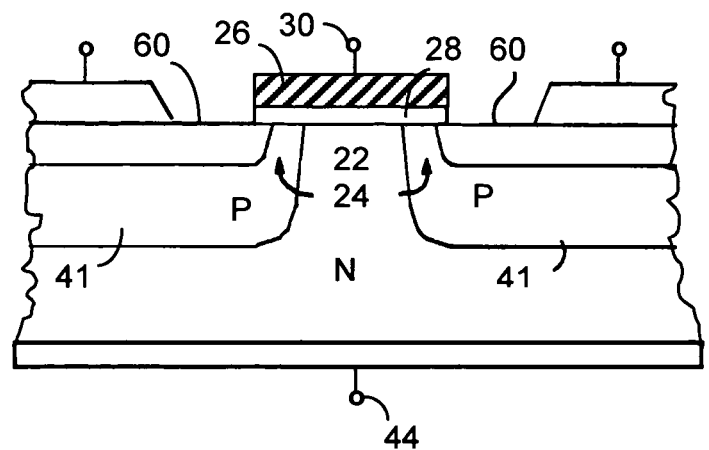
FIG. 1A is a cross sectional view of a conventional trenched MOSFET device implemented with a source contact by applying a metal with low barrier height.
Figure 1B:
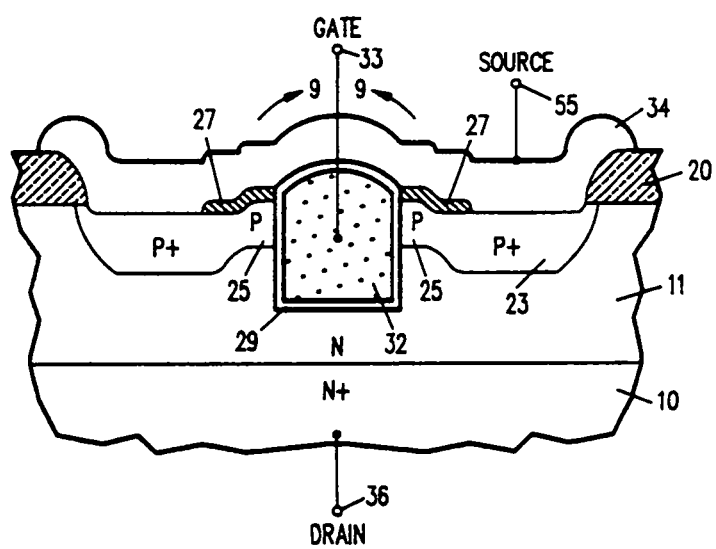
FIG. 1B shows another conventional semiconductor power device
Figure 2:
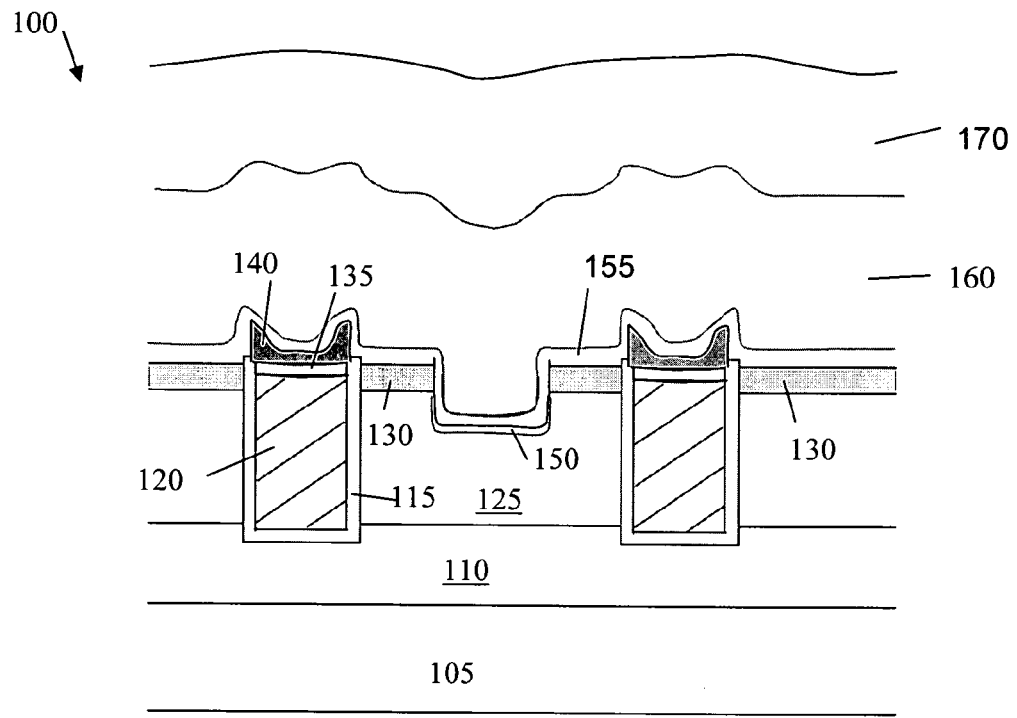
FIG. 2 is a cross sectional view of a trenched DMOS device as one exemplary embodiment of this invention.

Referring to FIG. 2 for a cross sectional view of a trenched DMOS device 100. The trenched DMOS device 100 is supported on a substrate formed with an epitaxial drift layer 110. The DMOS device further includes a plurality of trenches opened in the epitaxial drift region 110. The trenches are padded with a gate oxide layer 115 and filled with a gate material, e.g., polysilicon 120. A body region 125 doped with a body dopant, e.g., P-type body dopant, surrounding the trenched gates 120. Encompassed in the body regions 125 are source regions 130 near the top surface of the epitaxial drift region 110 surrounding the trenched gates 120. The source region 130 is formed with a low barrier height metal to function as a silicide Schottky source. The gates 120 are insulated further from the source region with a top insulation oxide layer 135 covered under an insulated spacer, e.g., silicon nitride spacers 140, covering over the top oxide layer 135.

The DMOS device 100 further includes a source contact trench opened in the body regions 125 above a body-contact dopant region 150. As will be further described below, the body-contact dopant regions 150 are implanted and activation prior to the formation of the metal Schottky barrier 130. The trenched contacts above the body contact dopant regions 150 are formed through mask to etch through the metal silicide at body contact region. This configuration provides direct ohmic contact to the transistor body to reduce the transistor body resistance.

A low resistance layer 155 such as a layer of Ti/TiN is formed to cover the source contact to further increase the contact area to the source and body regions. Additionally, the metallization of silicide layer 130 as the source region achieves a significantly reduced contact resistance. The DMOS device 100 further includes a metal contact layer 160 to function as a source metal and gate metal (not shown). An overlying passivation layer 170 further covers and protects the entire device.

Figure 3A:
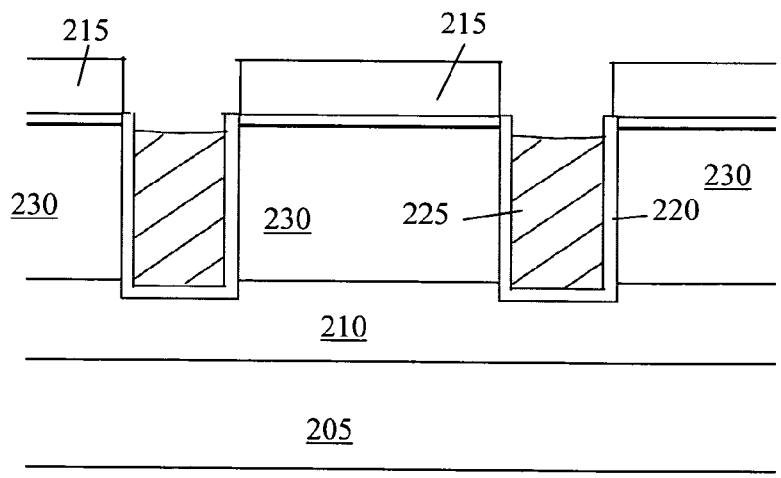
FIGS. 3A to 3K are a serial of cross sectional views for showing the manufacturing processes of a DMOS device of this invention as shown in FIG. 2.

Referring to FIGS. 3A to 3K for a serial of side cross sectional views to illustrate the fabrication steps of a DMOS-FET device as that shown in FIG. 2. In FIG. 3A, a pad oxidation is carried out to form a pad oxide layer and a hard mask layer 215 is deposited to function as a hard mask. A trench mask (not shown) is applied to etch a plurality of trenches through the hard mask layer 215 and the epitaxial drift layer 210 supported on a substrate 205. The trench is oxidized with a sacrificial oxide to remove the plasma damaged silicon layer during the process of opening the trench. An oxidation process is performed to form an oxide layer 220 covering the trench walls as the gate oxide for the transistors. Then a polysilicon layer 225 is deposited to fill the trench and covering the top surface and then doped with an N+ followed by applying a rapid thermal activation (RTA) process. Then the polysilicon layer is etched back as recessed trenched gate 225 surrounded by the hard mask layer 215. A body dopant implant and diffusion are performed to form the body regions 230.

Figure 3B:
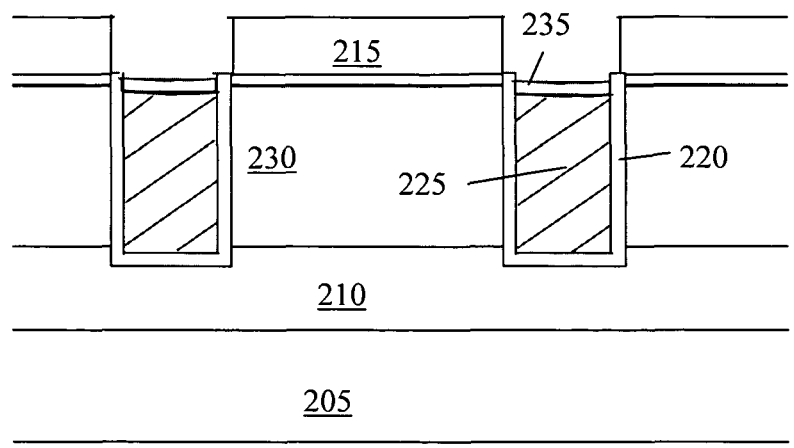
Figure 3C:
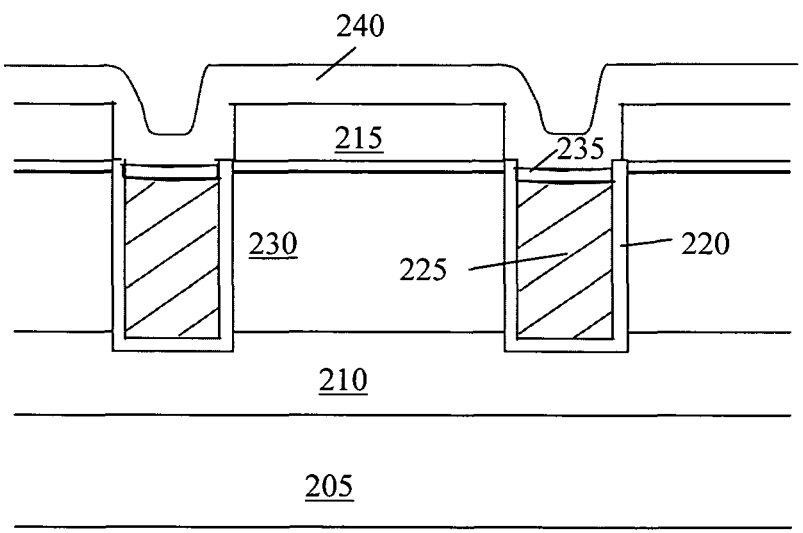
Figure 3D:
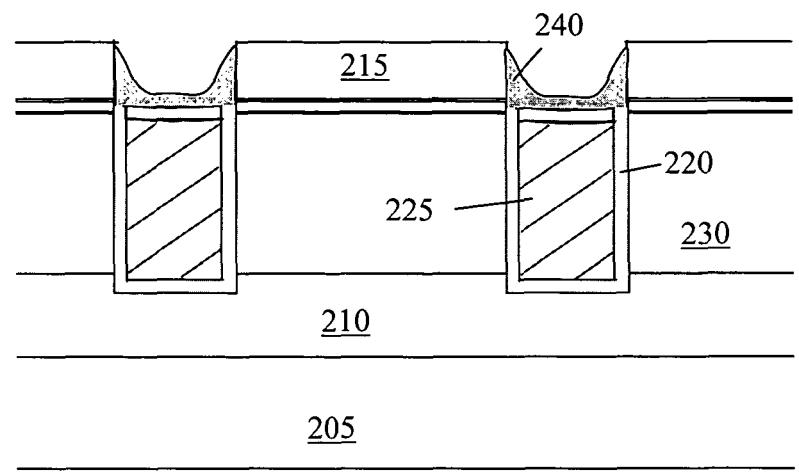
Figure 3E:
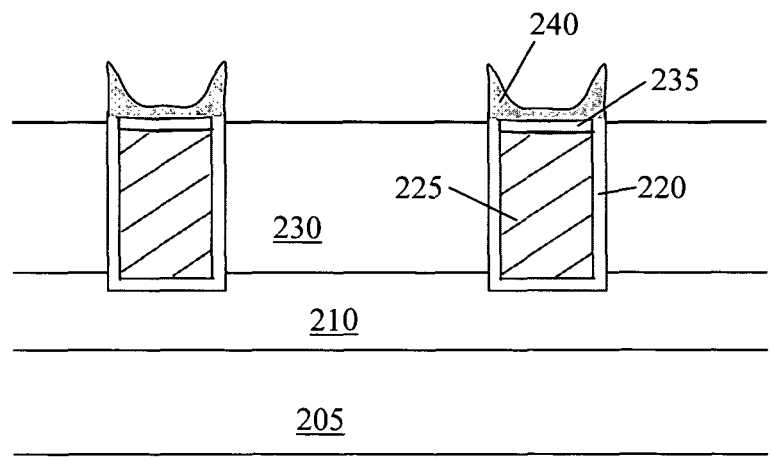

In FIG. 3B, a gate annealing and gate oxidation forms an oxide layer 235 covering the polysilicon gate 225. In FIG. 3C, a silicon nitride spacer layer 240 is deposited on top. In FIG. 3D, either a photoresist (not shown) is applied or a spin-on-glass (SOG) is spanned on (not shown) and then blank etch back is done, removing the silicon nitride layer 240 from the top of the hard mask leaving the spacer 240 around the side walls of the hard mask 215. Then the remaining photoresist or the SOG is removed with a cleaning process. In FIG. 3E, a dry etch followed by a wet etch process are applied to remove the oxide hard mask 215 so that the mesa silicon surface is fully exposed. A blank isotropic silicon etch is performed on the silicon mesa surface. The polysilicon gate 225 recess in reference to the mesa silicon surface is reduced. The source and gate overlap issues that could happen during the source silicidation process as will be further discussed below are mitigated. Special cares are taken in the hard mask removal processes to assure sufficient gate oxide and poly-oxide layer thickness at the gate mesa corners to prevent weakness between the source and the gate.

Figure 3F:
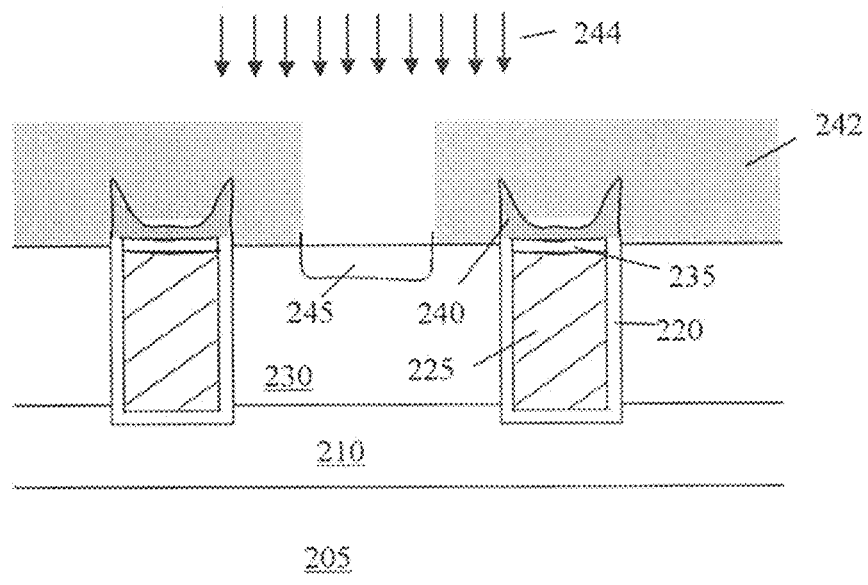
Figure 3G:
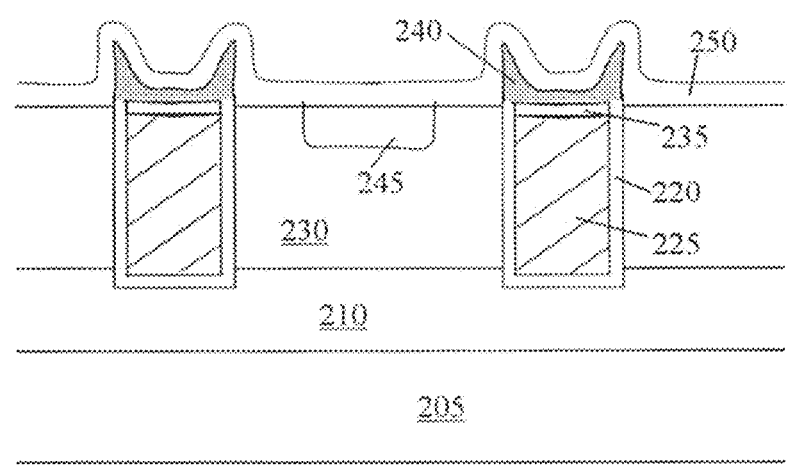
Figure 3H:
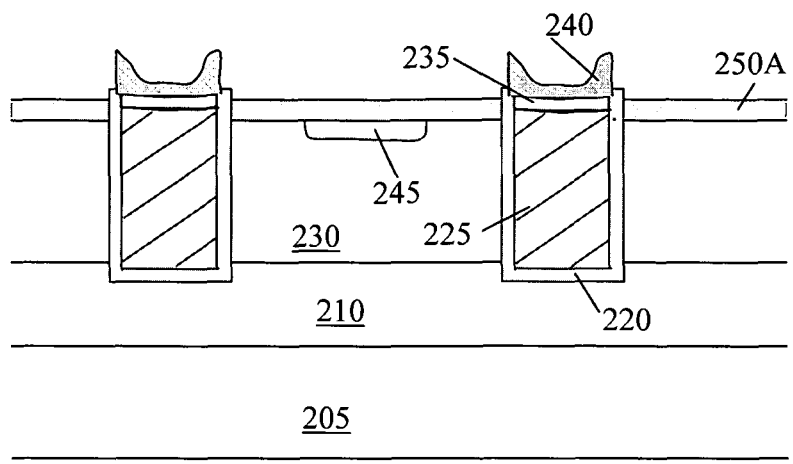

In FIG. 3F, a contact mask 242 is applied to implant contact dopant ions 244 to form body contact dopant region 245. In FIG. 3G, the contact mask 242 is removed and cleaned. A rapid thermal activation (RTA) for the contact dopant region 245 is carried out at a temperature around 900 to 950 C. Then, a platinum (PT) or other low barrier height metal layer 250 is deposited. The thickness of the metal layer 250 is carefully optimized to obtain a good source and gate overlap after the source silicidation. In FIG. 3H, silicidation process at low temperature of ~450 C that is well known in the art is carried out to form a low barrier height metal silicide layer, e.g., a PtSi layer 250A. The un-reacted platinum or other low barrier height metal is removed.

Figure 3I:
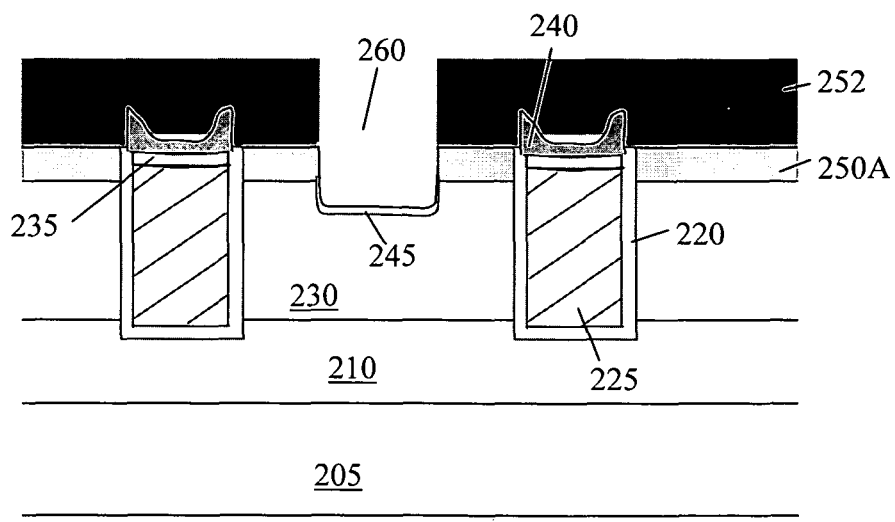
Figure 3J:
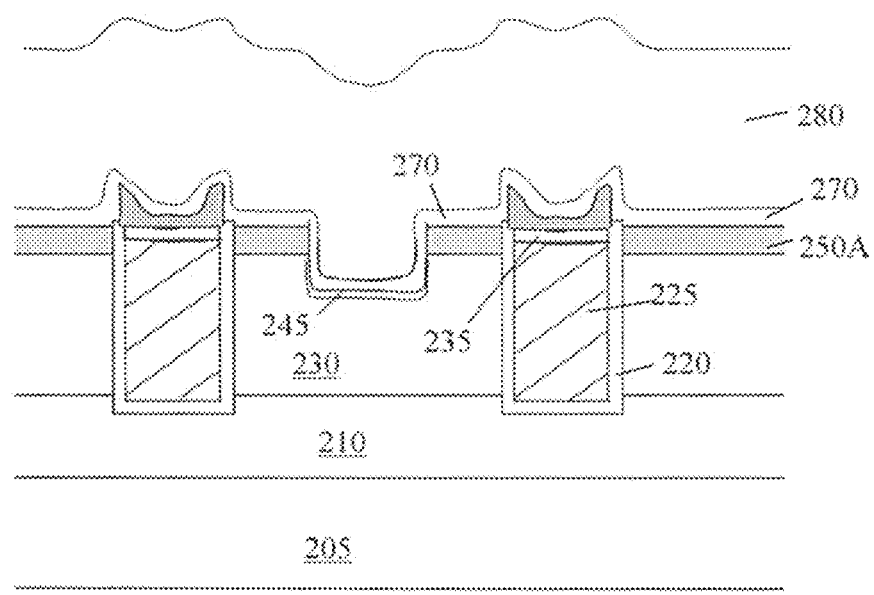
Figure 3K:
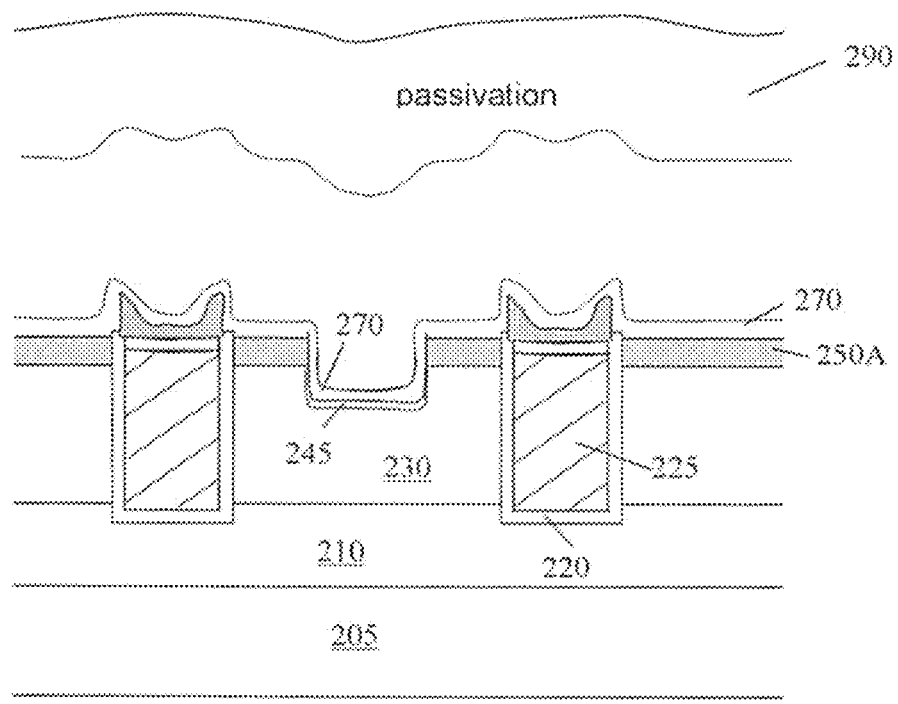

In FIG. 3I, a contact mask 252 is applied. A PtSi or other low barrier height metal silicide etch is carried out by applying an anisotropic etch with fluorine and chlorine gas mixture. The etch process can also be performed with a sputter etch with argon and oxygen gas mixture. Then a silicon etch is performed to open the contact opening 260 on top of the contact dopant region 245. Then a cleaning process is performed to remove the surface damages and clean the photoresist 252. In FIG. 3J, a low resistance Ti/TiN layer 270 is deposited on top followed by depositing a metal layer 280 on top. Then a metal mask is applied (not shown) to pattern the metal layer 270 into source metal and gate pad(s). In FIG. 3K, a passivation layer 290 is deposited on top to protect the device followed by applying a passivation mask (not shown) to pattern the passivation layer 290 to complete the manufacturing processes.

This DMOS device 100 and the manufacturing method overcome the disadvantages confronted by the conventional technologies. The processing steps of the DMOS device 100 provide the trenched and recessed polysilicon gate, and furnishing the body contact implant and activation prior to the metal Schottky barrier formation. Therefore, all the high-temperature processing steps are completed before the metal source silicidation. The processing steps and configuration enable the employment of low-barrier height rare earth metal silicide for the best drive current. In the meantime, a trench contact is formulated through mask and etching of the metal silicide at body contact region, to form an ohmic contact to the transistor body. Eventually, a metallization is done to contact the whole mesa region (source and body contact), achieving low contact resistances.

According to FIGS. 3A to 3K and above descriptions, this invention discloses a method for manufacturing a trenched semiconductor power device. The method includes a step of employing a low barrier-height rare earth metal for performing a metal source silicidation to form a source region surrounding a trenched gate of the semiconductor power device wherein the low barrier-height rare earth metal silicide having a barrier height in an approximate range of 0.20 to 0.35 eV to function as a Schottky source. In a preferred embodiment, the method further includes a step of completing a plurality of high temperature processing steps before the step of metal source silicidation for enabling an employment of the a low barrier-height rare earth metal. In another preferred embodiment, the method further includes a step of completing a plurality of high temperature processing steps including a step of formation of the trenched gate and furnishing a body contact implant and activation before the step of metal source silicidation for enabling an employment of the low barrier-height rare earth metal.

Figure 4:
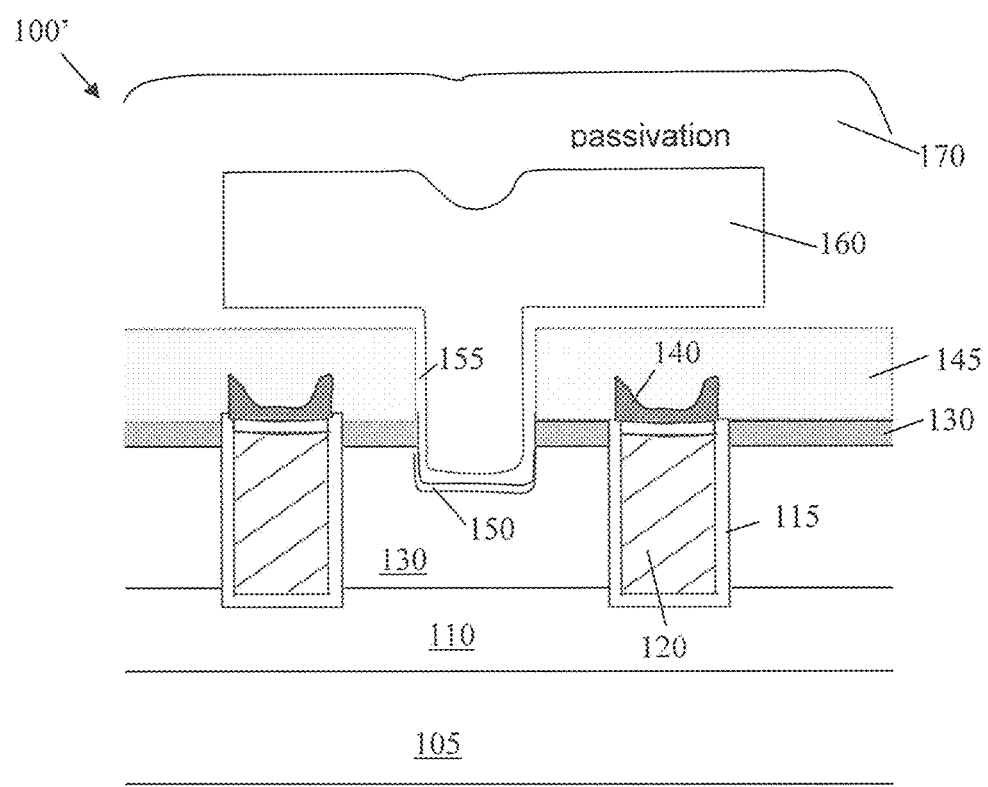
FIG. 4 is a cross sectional view of a trenched DMOS device as another exemplary embodiment of this invention.

FIG. 4 shows a cross sectional view of an alternate preferred embodiment of a DMOS device 100' this invention. The DMOS 100' has a similar device configuration as the DMOS 100 shown in FIG. 2 except that an insulation layer, e.g., a BPSG layer 145 is formed on top of the gate spacer 140 and the silicide source regions 130 to further insulate the gate from the source contact metal 160. Such device has a further advantage to accommodate higher ratings in Vgs of the devices with the better insulation between gate and source metals.

In a preferred embodiment, this invention discloses a trenched semiconductor power device. The trenched semiconductor power device includes a trenched gate insulated by a gate insulation layer and surrounded by a source region encompassed in a body region above a drain region disposed on a bottom surface of a semiconductor substrate. source region surrounding the trenched gate includes a metal of low barrier height in an approximate range of 0.1 to 0.5 eV and preferably between 0.20 to 0.35 eV to function as a Schottky source. In a preferred embodiment, the metal of low barrier height further includes a PtSi layer. In a preferred embodiment, the metal of low barrier height further includes a ErSi layer. In a preferred embodiment, the metal of low barrier height further includes a metal silicide layer having the low barrier height. In a preferred embodiment, the semiconductor power device further includes a top insulation layer disposed under an insulation spacer on top of the trenched gate for insulating the trenched gate from the source region. In a preferred embodiment, the semiconductor power device further includes a top oxide layer disposed under a silicon nitride spacer on top of the trenched gate for insulating the trenched gate from the source region. In a preferred embodiment, the semiconductor power device further includes a source contact disposed in a trench opened into the body region for contacting a body-contact dopant region and covering with a conductive metal layer. In a preferred embodiment, the semiconductor power device further includes a source contact trench opened into the body region for contacting a body-contact dopant region and covering with a Ti/TiN metal layer. In a preferred embodiment, the semiconductor power device further includes a N-channel double diffusion metal oxide semiconductor (DMOS) device. In a preferred embodiment, the semiconductor power device further includes a P-channel DMOS device. In a preferred embodiment, the semiconductor power device further includes an asymmetrical double diffusion metal oxide semiconductor field effect transistor (DMOSFET) device. Its asymmetry arises from the fact that the source of the transistor is an Schottky metal silicide, yet the drain is of a silicon junction.

Although the present invention has been described in terms of the presently preferred embodiment, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

We claim:

1. A method for manufacturing a trenched semiconductor power device comprising a plurality of trenched gates which are insulated by a gate insulation layer and surrounded by a source region, which in turn is encompassed in a body region above a drain region, which in turn is disposed on a bottom portion of a semiconductor substrate, the method comprising:
    forming each of said trenched gates with a spacer cap on top of the trenched gate and having vertical cap edges substantially aligned with gate sidewalls of the trenched gates, and forming the source region surrounding the trenched gates;
    opening a source-body contact trench substantially in a middle portion between two of the trenched gates;
    forming a low resistance metal layer for covering a top surface of the source region wherein the low resistance layer further covers trench sidewalls of the source-body contact trench;
    filling said source body contact trench with a source contact metal layer for directly contacting the low-resistance metal layer; and
    wherein the step of forming the source region further comprises a step of forming the source region as a metal silicide source aligned substantially with one edge of the spacer cap on top of the trenched gate.

2. The method of claim 1 further comprising:
the step of forming the source region surrounding the trenched gates further comprises a step of forming the source region as a PtSi silicide source.

3. The method of claim 1 further comprising:
the step of forming the source region surrounding the trenched gates further comprises a step of forming the source region as a ErSi silicide source.

4. The method of claim 1 wherein:
the step of forming the source region surrounding the trenched gates further comprises a step of forming the source region as a metal silicide source having a thermal stability substantially in a same range as a thermal stability of PtSi silicide and ErSi silicide.

5. The method of claim 1 further comprising:
forming a top gate insulation layer on top of said trenched gate and underneath the spacer cap as an insulation spacer for insulating the trenched gate from the source region.

6. The method of claim 1 further comprising:
forming a top silicon nitride layer as a top gate insulation layer on top of said trenched gate and underneath the spacer cap as an insulation spacer for insulating the trenched gate from the source region.

7. The method of claim 1 further comprising:
forming a top silicon oxide layer as a top gate insulation layer on top of said trenched gate and underneath the spacer cap as an insulation spacer for insulating said trenched gate from said source region.

8. The method of claim 1 wherein:

the step of forming the spacer cap on top of said trenched gate further comprises a step of forming the spacer cap as a concave-shaped insulation spacer for insulating said trenched gate from said source region.

9. The method of claim 1 wherein:

the step of forming the trenched gates further comprises a step of filling the trenched gates with a gate polysilicon up to a level lower than a top surface of a trench of the trenched gate with a top oxide layer filling a top portion of said trenched gate on top of the gate polysilicon with the top oxide layer totally covering the gate polysilicon.

10. The method of claim 1 wherein:

the step of forming the low resistance metal layer for covering a top surface of the source region further comprises a step of forming a Ti/TiN metal layer.

11. The method of claim 1 wherein:

said method of manufacturing said trenched semiconductor power device comprises a step of manufacturing a N-channel double diffusion metal oxide semiconductor (DMOS) device.

12. The method of claim 1 wherein:

said method of manufacturing said trenched semiconductor power device comprises a step of manufacturing a P-channel double diffusion metal oxide semiconductor (DMOS) device.

13. The method claim 1 wherein:

said method of manufacturing said trenched semiconductor power device comprises a step of manufacturing a N-channel double diffusion metal oxide semiconductor field effect transistor (DMOSFET) device.

14. The method of claim 1 further comprising:

forming a top gate insulation layer on top of the trenched gate and underneath the spacer cap as a self-aligned concave-shaped insulation spacer, which extends laterally over the top gate insulation layer on top of the trenched gate to totally cover the top gate insulation layer for insulating the trenched gate from said source region.

15. The method of claim 1 wherein:

the step of forming the low resistance metal layer further comprises a step of forming a Ti/TiN metal layer as a source contact layer on a bottom surface of said source-body contact trench.

* * * * *